(12) United States Patent
Matsumoto

(10) Patent No.: US 8,697,464 B2
(45) Date of Patent: Apr. 15, 2014

(54) METHOD OF MANUFACTURING OPTICAL SEMICONDUCTOR DEVICE

(75) Inventor: Keisuke Matsumoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 136 days.

(21) Appl. No.: 13/539,568

(22) Filed: Jul. 2, 2012

(65) Prior Publication Data

US 2013/0122623 A1    May 16, 2013

(30) Foreign Application Priority Data

Nov. 16, 2011    (JP) ................................ 2011-250404

(51) Int. Cl.
*H01L 21/288*    (2006.01)
*H01L 33/36*    (2010.01)

(52) U.S. Cl.
USPC ...... 438/34; 438/605; 438/686; 257/E21.175; 257/E33.063

(58) Field of Classification Search
USPC ............................ 438/33, 34, 605, 677, 686; 257/E21.175, E33.063
See application file for complete search history.

(56) References Cited

U.S. PATENT DOCUMENTS

| | | | |
|---|---|---|---|
| 7,432,119 B2 * | 10/2008 | Doan | 438/33 |
| 7,829,440 B2 * | 11/2010 | Chu et al. | 438/33 |
| 2001/0030330 A1 | 10/2001 | Inomoto | |
| 2002/0050596 A1 | 5/2002 | Otsuka et al. | |
| 2005/0019971 A1 * | 1/2005 | Slater et al. | 438/33 |
| 2006/0039428 A1 | 2/2006 | Kondou | |
| 2007/0212854 A1 * | 9/2007 | Chu et al. | 438/464 |
| 2008/0210969 A1 * | 9/2008 | Yuan et al. | 438/33 |
| 2009/0093075 A1 * | 4/2009 | Doan | 438/33 |
| 2010/0200864 A1 * | 8/2010 | Chu et al. | 438/33 |

FOREIGN PATENT DOCUMENTS

| | | |
|---|---|---|
| JP | 6-97589 A | 4/1994 |
| JP | 2001-298211 A | 10/2001 |
| JP | 2003-8135 A | 1/2003 |
| JP | 2006-59881 A | 3/2006 |

* cited by examiner

*Primary Examiner* — Zandra Smith
*Assistant Examiner* — Toniae Thomas
(74) *Attorney, Agent, or Firm* — Leydig, Voit, Mayer, Ltd.

(57) ABSTRACT

A method of manufacturing an optical semiconductor device includes: forming first and second optical semiconductor elements separated from each other by a separation groove on a semiconductor substrate; forming first and second electrodes containing Pt on top surfaces of the first and second optical semiconductor elements, respectively; forming a third electrode electrically connected to the first and second electrodes and preventing the third electrode from being formed in the separation groove; forming first and second Au plated layers on the first and second electrodes, respectively, by electrolytic plating, using the third electrode as a power supply layer; forming a resist covering the first and second Au plated layers by photolithography; and etching the third electrode, using the resist as a mask, to electrically separate the first electrode from the second electrode.

4 Claims, 11 Drawing Sheets

US 8,697,464 B2

METHOD OF MANUFACTURING OPTICAL SEMICONDUCTOR DEVICE

BACKGROUND OF THE INVENTION

1. Field of the Invention

The present invention relates to a method of manufacturing an optical semiconductor device that is mainly applied to the optical communication field.

2. Background Art

Optical semiconductor elements such as laser diodes are used in the optical communication field (e.g., see Japanese Patent Laid-Open No. 6-97589). In an optical semiconductor device whose two neighboring optical semiconductor elements are separated by a separation groove, an Au plated layer is formed on the top surface of each optical semiconductor element. In this case, after forming a power supply layer on the entire surface and applying plating thereto, the power supply layer is wet-etched using photolithography.

SUMMARY OF THE INVENTION

When the separation groove is deep, it is difficult to match resist transfer conditions between the top surface of the optical semiconductor element and the bottom surface of the separation groove. Therefore, resist remainder is left in the separation groove, which prevents the power supply layer in the separation groove from being completely etched, causing electrodes of the neighboring optical semiconductor elements to be short-circuited.

Furthermore, Pt which cannot be wet-etched cannot be used as the substance of the power supply layer. Thus, since the power supply layer between the Au plated layer and the optical semiconductor element does not contain Pt, Au in the Au plated layer may sink into the crystal of the optical semiconductor element. As a result, reliability may deteriorate.

In view of the above-described problems, an object of the present invention is to provide a method of manufacturing an optical semiconductor device that can improve reliability.

According to the present invention, a method of manufacturing an optical semiconductor device includes: forming first and second optical semiconductor elements separated apart by a separation groove on a semiconductor substrate; forming first and second electrodes containing Pt on top surfaces of the first and second optical semiconductor elements respectively; forming a third electrode electrically connected to the first and second electrodes; forming first and second Au plated layers on the first and second electrodes respectively through an electrolytic plating method using the third electrode as a power supply layer; forming a first resist covering the first and second Au plated layers through photolithography; and etching the third electrode using the first resist as a mask to electrically separate the first electrode from the second electrode. The third electrode is prevented from being formed in the separation groove in the step of forming the third electrode.

The present invention makes it possible to improve reliability.

Other and further objects, features and advantages of the invention will appear more fully from the following description.

DETAILED DESCRIPTION OF THE PREFERRED EMBODIMENTS

A method of manufacturing an optical semiconductor device according to an embodiment of the present invention will be described with reference to the accompanying drawings. FIGS. 1 to 6, 8, 11, 14 and 16 are perspective views illustrating the method of manufacturing an optical semiconductor device according to the embodiment of the present invention. FIGS. 7, 9, 10, 12, 13 and 15 are cross-sectional views.

Figure 1:
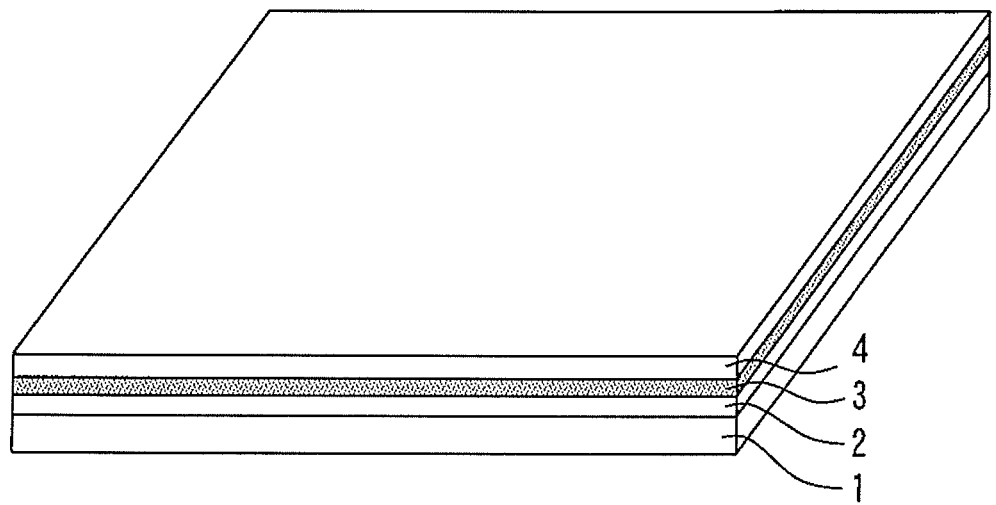
FIGS. 1 to 6, 8, 11, 14 and 16 are perspective views illustrating the method of manufacturing an optical semiconductor device according to the embodiment of the present invention.

First, as shown in FIG. 1, an n-InP clad layer 2, an active layer 3 and a p-InP clad layer 4 are formed in order on an n-InP substrate 1.

Figure 2:
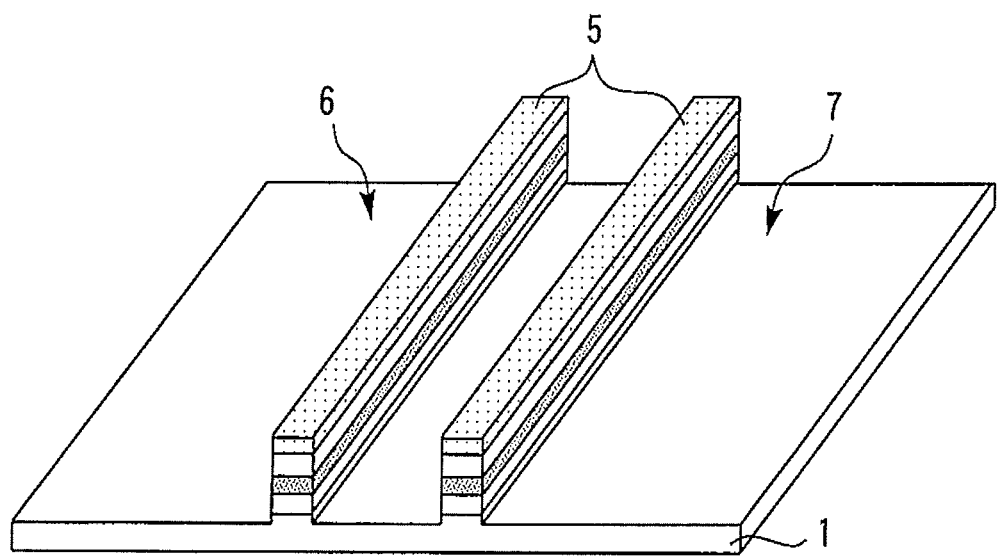

Next, as shown in FIG. 2, a stripe-shaped insulating film 5 is formed on the p-InP clad layer 4. Through dry etching using this insulating film 5 as a mask, ridge-type waveguides 6 and 7 are formed. The ridge-type waveguides 6 and 7 are 2 to 3 µm in depth, 1 to 2 µm in width, and the distance between the ridge-type waveguides 6 and 7 is 20 to 30 µm.

Figure 3:
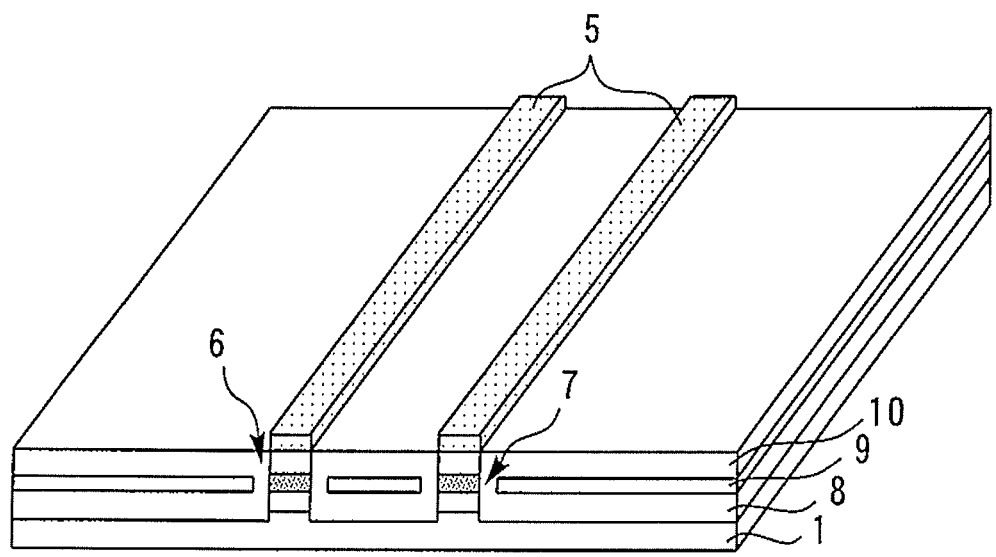

Next, as shown in FIG. 3, a p-InP layer 8, an n-InP layer 9 and a p-InP layer 10 are embedded in order at both ends of the ridge-type waveguides 6 and 7 using the insulating film 5 as a mask.

Figure 4:
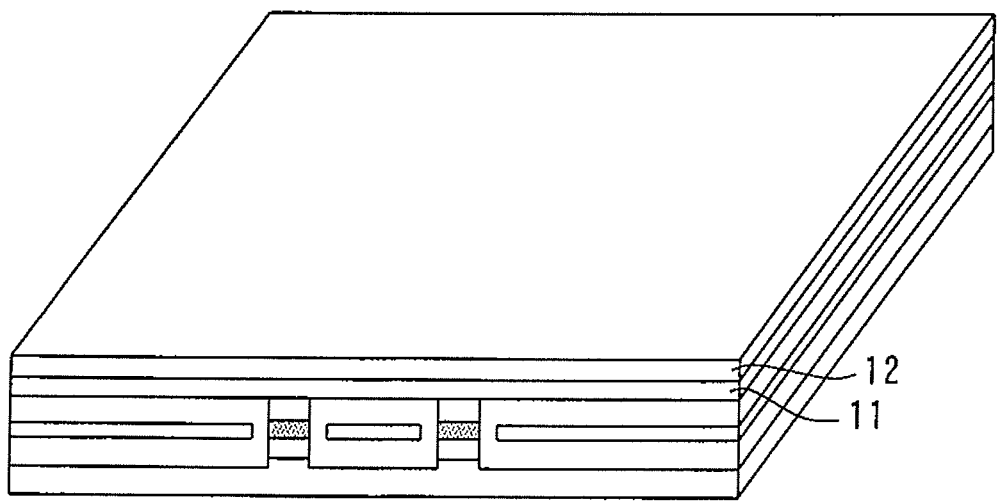

Next, as shown in FIG. 4, the insulating film 5 is removed and a p-InP clad layer 11 and a p-InGaAs contact layer 12 are formed in order over the entire surface.

Figure 5:
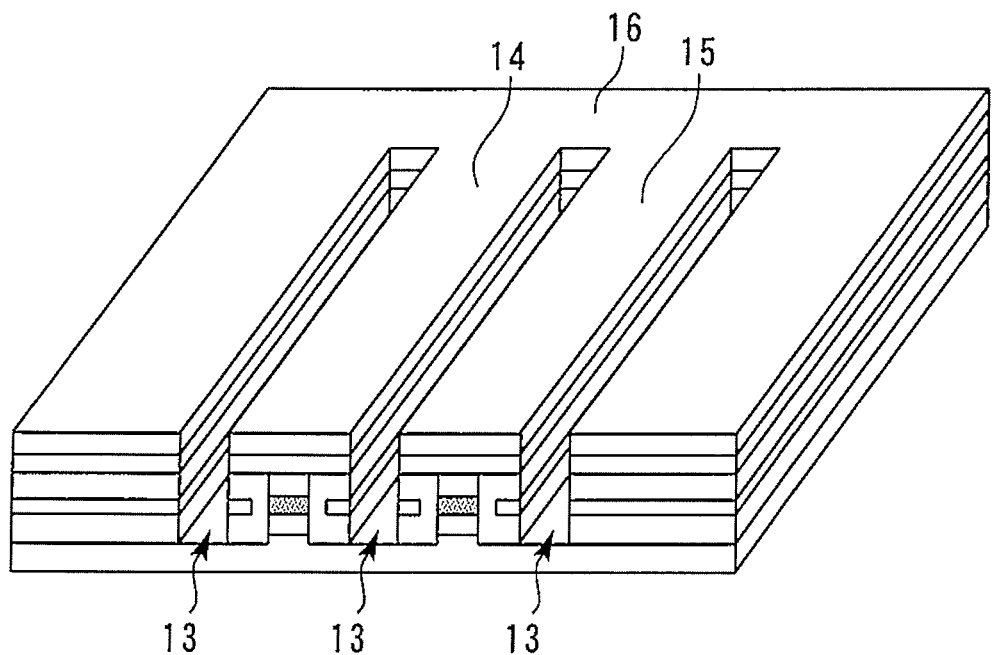

Next, as shown in FIG. 5, separation grooves 13 are formed. The separation grooves 13 are 6 to 10 µm in depth and 5 to 10 µm in width. In this way, optical semiconductor elements 14 and 15, and a connection section 16 are formed on the n-InP substrate 1. The optical semiconductor elements 14 and 15 are laser diodes separated apart by the separation grooves 13. Parts of the optical semiconductor elements 14 and 15 are connected to the connection section 16 respectively. The connection section 16 has a top surface flush with the top surfaces of the optical semiconductor elements 14 and 15.

Figure 6:
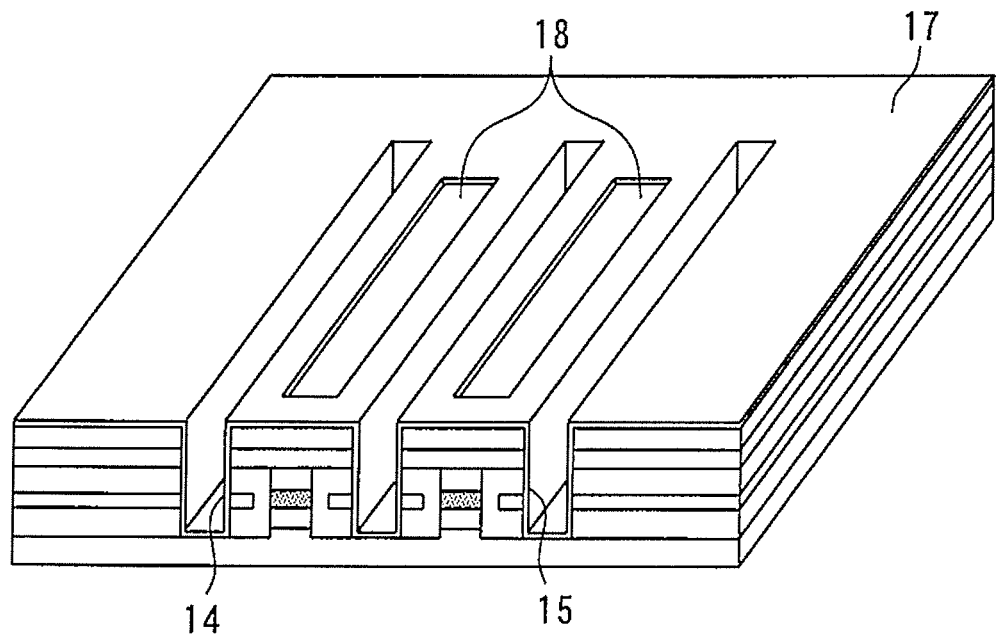

Next, as shown in FIG. 6, an insulating film 17 is formed over the entire surface and openings 18 are formed in the insulating film 17 on the top surfaces of the optical semiconductor elements 14 and 15 through photolithography or the like.

Figure 7:
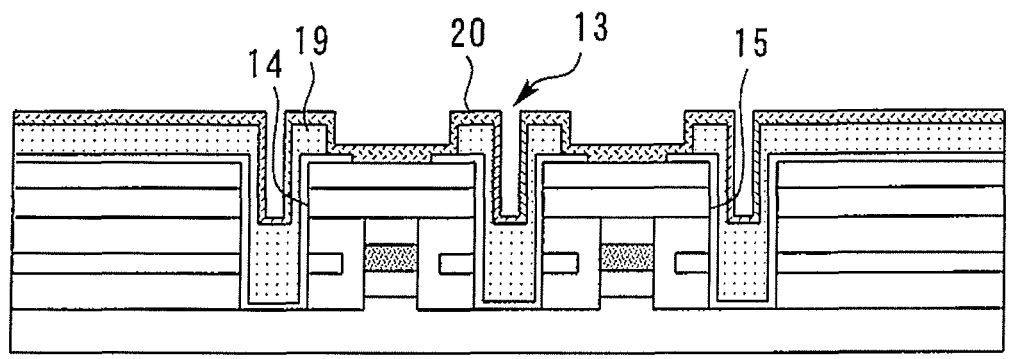
FIGS. 7, 9, 10, 12, 13 and 15 are cross-sectional views illustrating the method of manufacturing an optical semiconductor device according to the embodiment of the present invention.

Next, as shown in FIG. 7, a resist 19 is formed in a region other than the top surfaces of the optical semiconductor elements 14 and 15 and a metal film 20 is formed over the entire surface. The metal film 20 is made of Ti/Pt/Au (outermost surface is Au).

Figure 8:
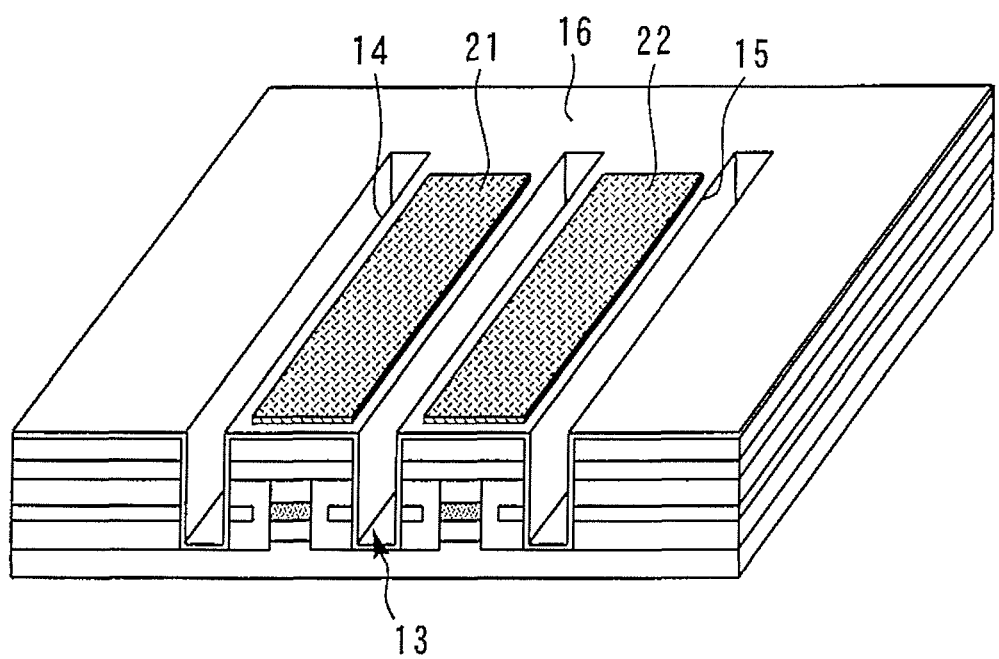
Figure 9:
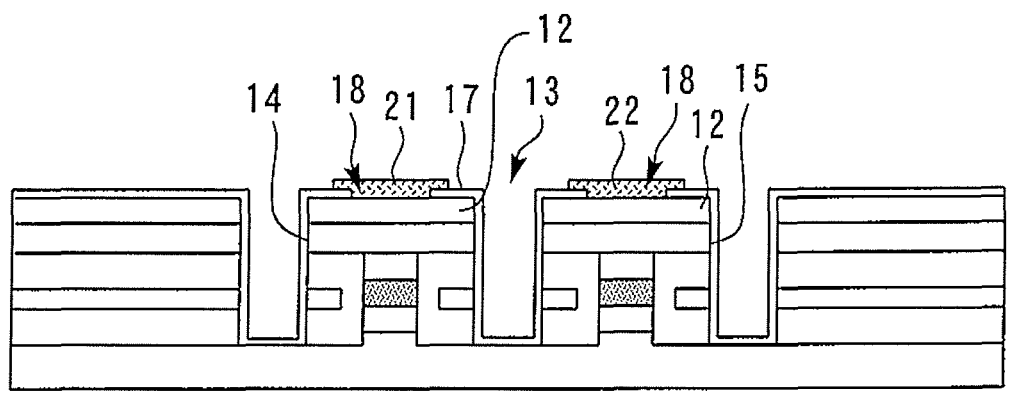

Next, as shown in FIGS. 8 and 9, the metal film 20 existing on the top surface of the resist 19 is removed together with the resist 19 (lift-off method). Thus, Pt-containing electrodes 21 and 22 are formed only on the top surfaces of the optical semiconductor elements 14 and 15. The electrodes 21 and 22 are electrically connected to the p-InGaAs contact layer 12 of the optical semiconductor elements 14 and 15 via the openings 18 of the insulating film 17.

Figure 10:
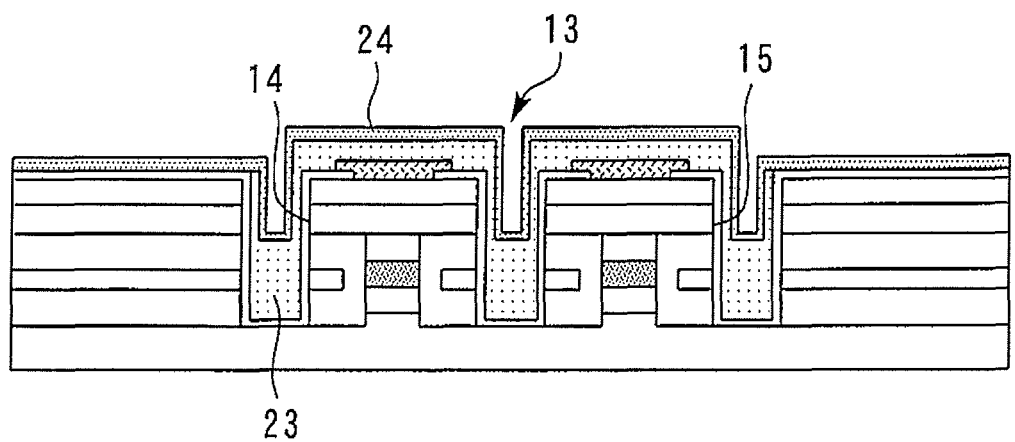

Next, as shown in FIG. 10, a resist 23 is embedded in the separation grooves 13 and the resist 23 is also formed on the top surfaces of the optical semiconductor elements 14 and 15. An electrode 24 is formed on the top surface of the resist 23 and the top surface of the connection section 16. The electrode 24 is made of Cr/Au or Ti/Au (all the outermost face of which is made of Au) or the like.

Figure 11:
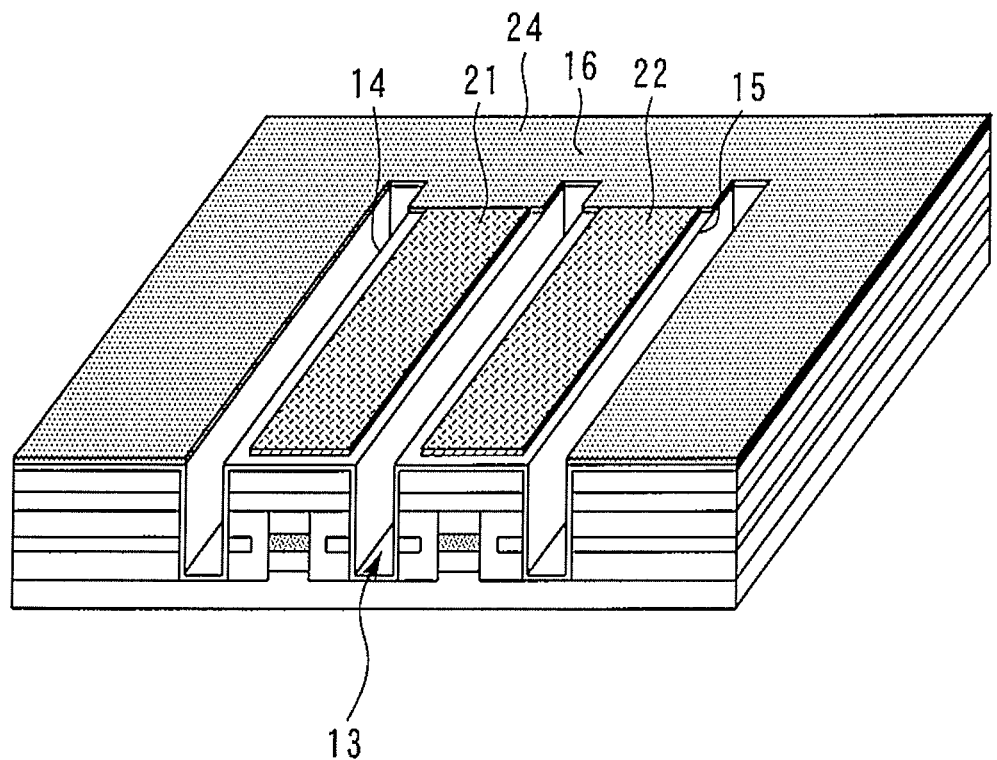
Figure 12:
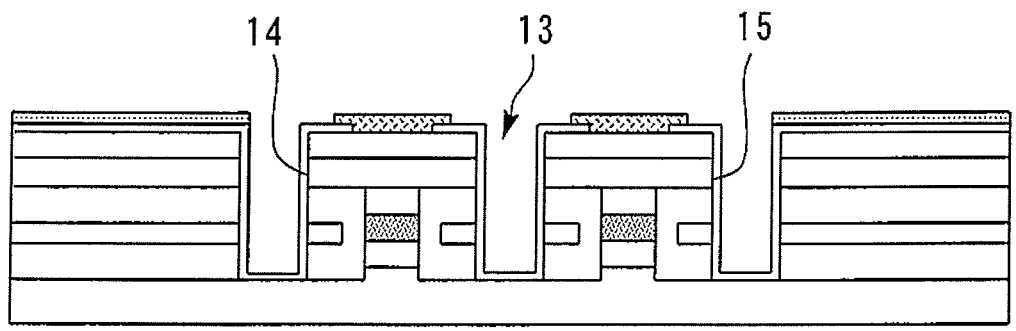

Next, as shown in FIGS. 11 and 12, the electrode 24 existing on the top surface of the resist 23 is removed together with the resist 23 (lift-off method). Thus, the electrode 24 electrically connected to the electrodes 21 and 22 is formed on the top surface of the connection section 16. The lift-off method using this resist 23 prevents the electrode 24 from being formed in the separation grooves 13.

Figure 13:
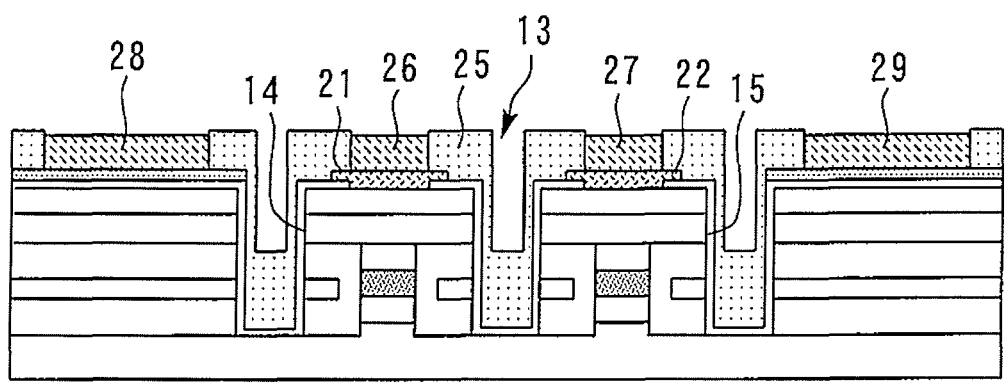
Figure 14:
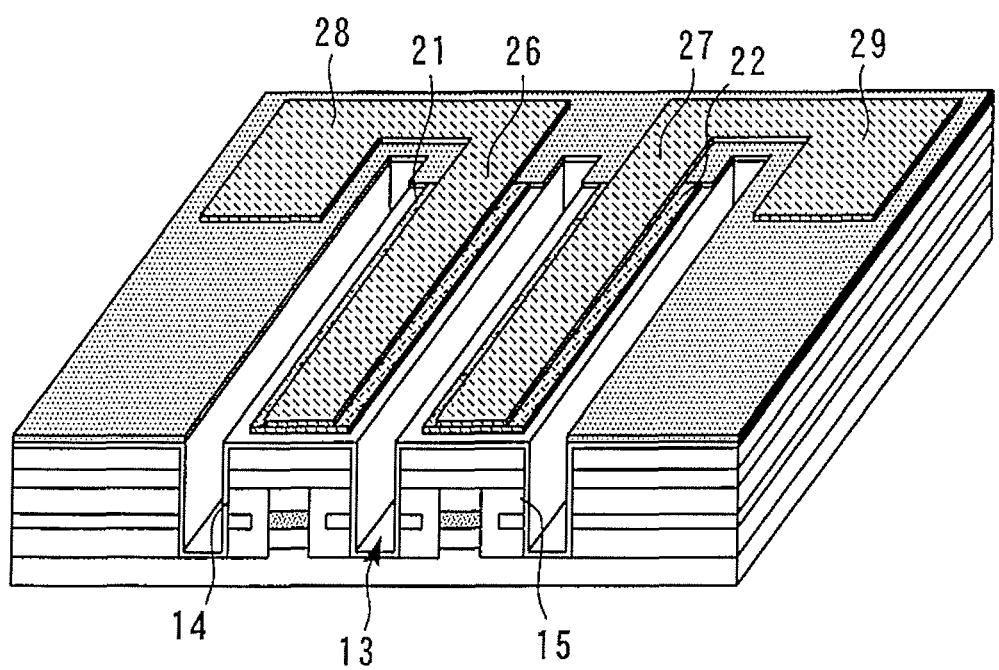

Next, as shown in FIGS. 13 and 14, regions other than parts of the electrodes 21 and 22, and the electrode 24 are covered with a resist 25. Au plated layers 26 and 27 are formed on the electrodes 21 and 22 respectively through an electrolytic plating method using the electrode 24 as a power supply layer and electrode pads 28 and 29 are formed on the electrode 24. The electrode pads 28 and 29 are connected to the Au plated layers 26 and 27 and used for wiring. Later, the resist 25 is removed.

Figure 15:
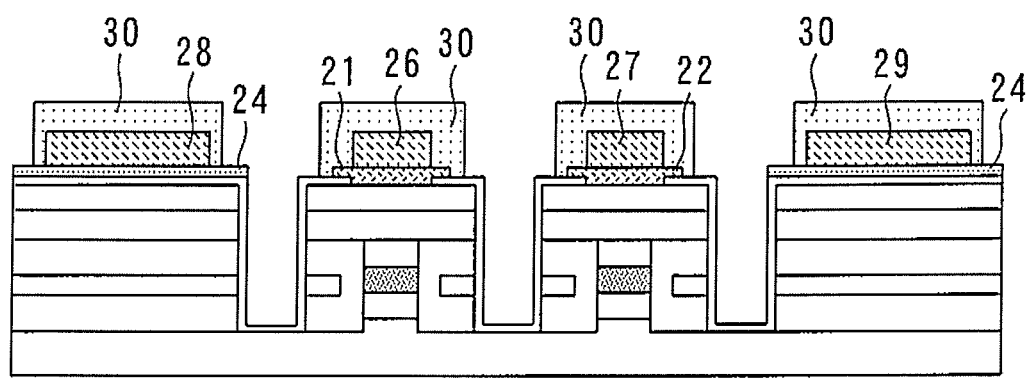
Figure 16:
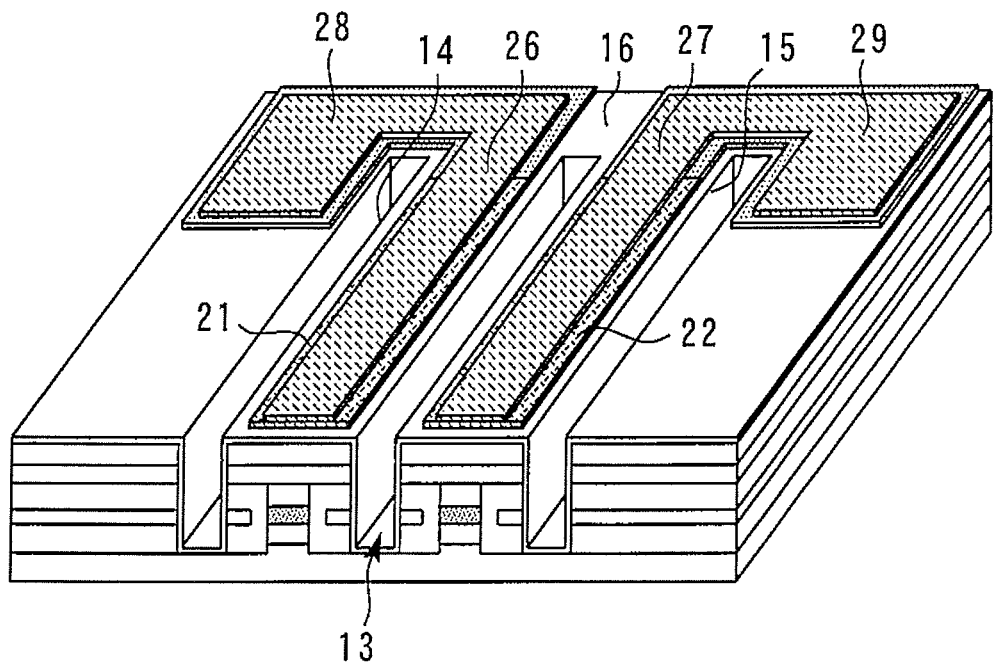

Next, as shown in FIG. 15, a resist 30 that covers the Au plated layers 26 and 27, the electrode pads 28 and 29 and the electrode 24 in the vicinity thereof is formed through photolithography. As shown in FIG. 16, the electrode 24 is then wet-etched using the resist 30 as a mask to electrically separate the electrode 21 from the electrode 22. Here, since the electrode 24 does not contain Pt, the electrode 24 can be wet-etched. After that, the resist 30 is removed.

Next, effects of the present embodiment will be described in comparison with comparative examples 1 to 3. FIGS. 17 and 18, FIGS. 19 and 20, and FIGS. 21 and 22 are perspective views illustrating methods of manufacturing an optical semiconductor device according to comparative example 1, comparative example 2, and comparative example 3 respectively.

Figure 17:
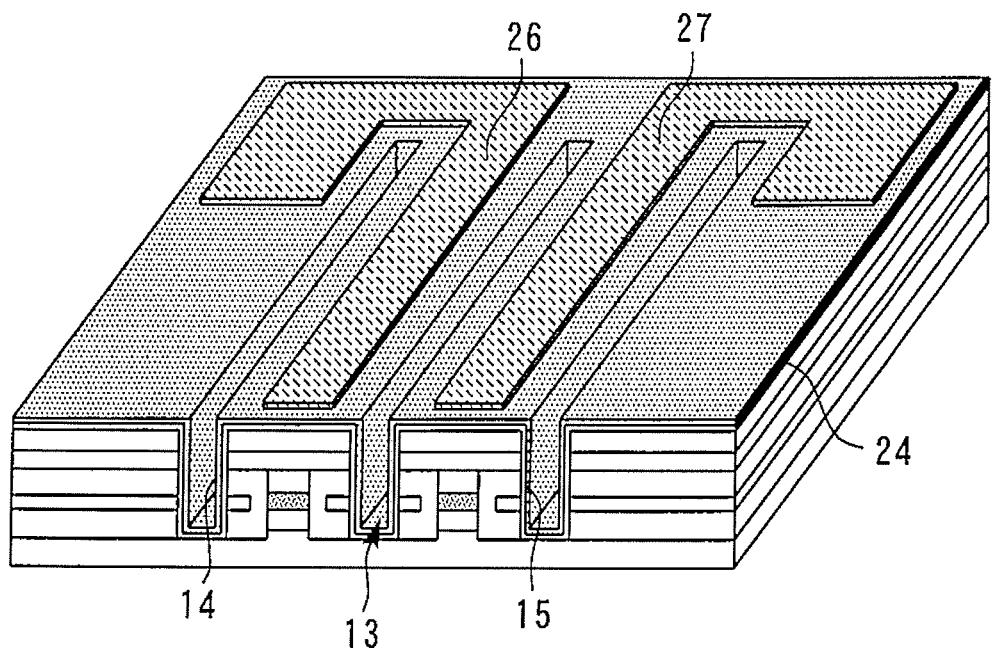
FIGS. 17 and 18 are perspective views illustrating methods of manufacturing an optical semiconductor device according to comparative example 1.
Figure 18:
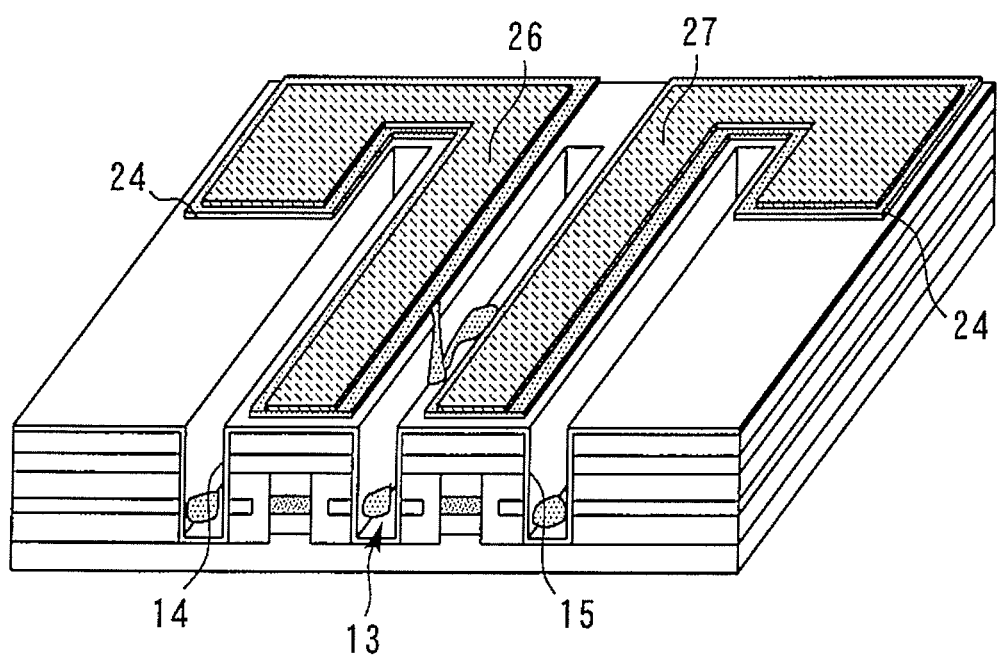

In comparative example 1, the electrode 24 is formed over the entire surface after the steps in FIGS. 1 to 6 as shown in FIG. 17. The Au plated layers 26 and 27 are formed on the top surfaces of the optical semiconductor elements 14 and 15 according to an electrolytic plating method using this electrode 24 as a power supply layer. Next, as shown in FIG. 18, the electrode 24 is wet-etched using a resist (not shown) formed through photolithography as a mask. Here, when the separation groove 13 is deep (e.g., 6 µm or more), it is difficult to match resist transfer conditions between the top surfaces of the optical semiconductor elements 14 and 15 and the bottom surface of the separation groove 13. Therefore, resist remainder is left in the separation groove 13, which prevents the electrode 24 in the separation groove 13 from being completely etched, causing the electrodes of the neighboring optical semiconductor elements 14 and 15 to be short-circuited. Furthermore, Pt which cannot be wet-etched cannot be used as the substance of the electrode 24. Thus, since the electrode 24 does not contain Pt, which is a barrier metal, Au sinks into the crystal.

Figure 19:
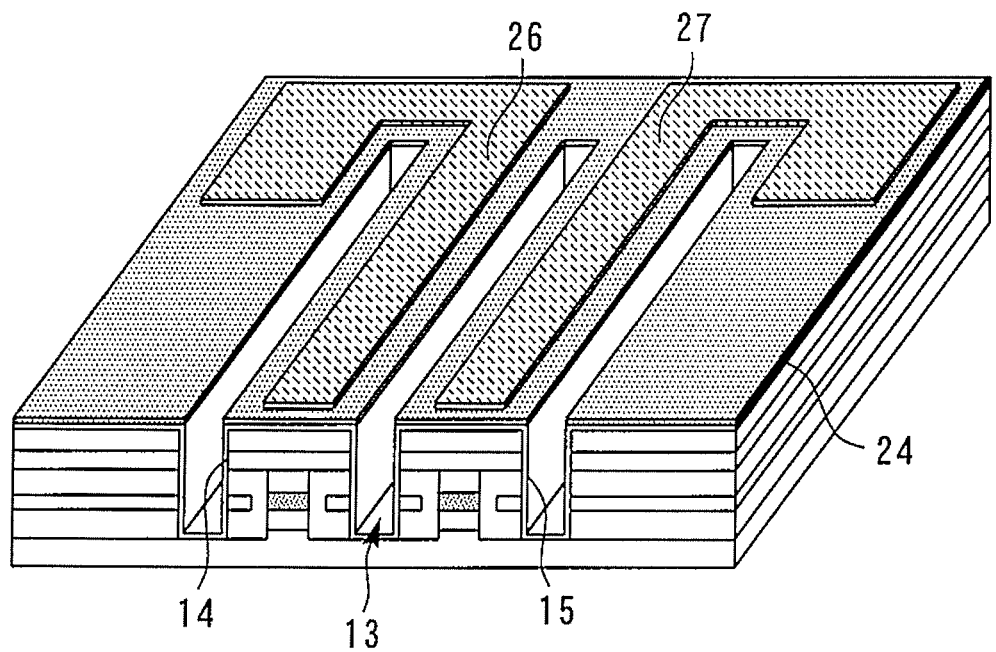
FIGS. 19 and 20 are perspective views illustrating methods of manufacturing an optical semiconductor device according to comparative example 2.
Figure 20:
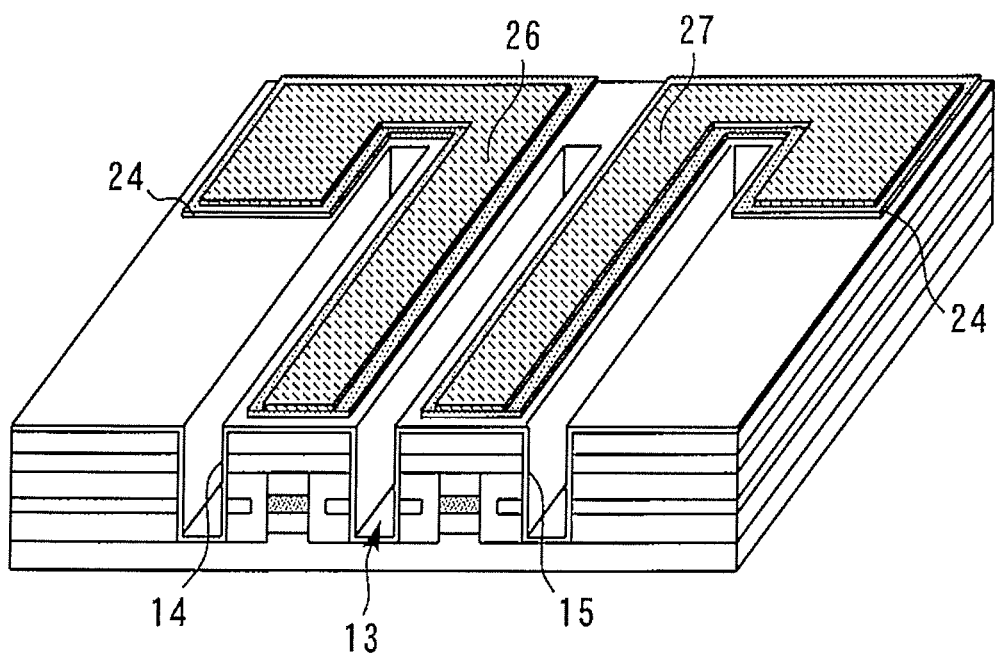

In comparative example 2, the electrode 24 is formed on the top surfaces of the optical semiconductor elements 14 and 15 after the steps in FIGS. 1 to 6 using a lift-off method as shown in FIG. 19. In this case, the electrode 24 is prevented from being formed in the separation groove 13. The Au plated layers 26 and 27 are formed according to an electrolytic plating method using this electrode 24 as a power supply layer. Next, as shown in FIG. 20, the electrode 24 is wet-etched using a resist (not shown) formed through photolithography as a mask. Since no electrode 24 is formed in the separation groove 13 in comparative example 2, it is possible to prevent the electrodes of the neighboring optical semiconductor elements 14 and 15 from being short-circuited. However, since the electrode 24 does not contain Pt, Au sinks into the crystal.

Figure 21:
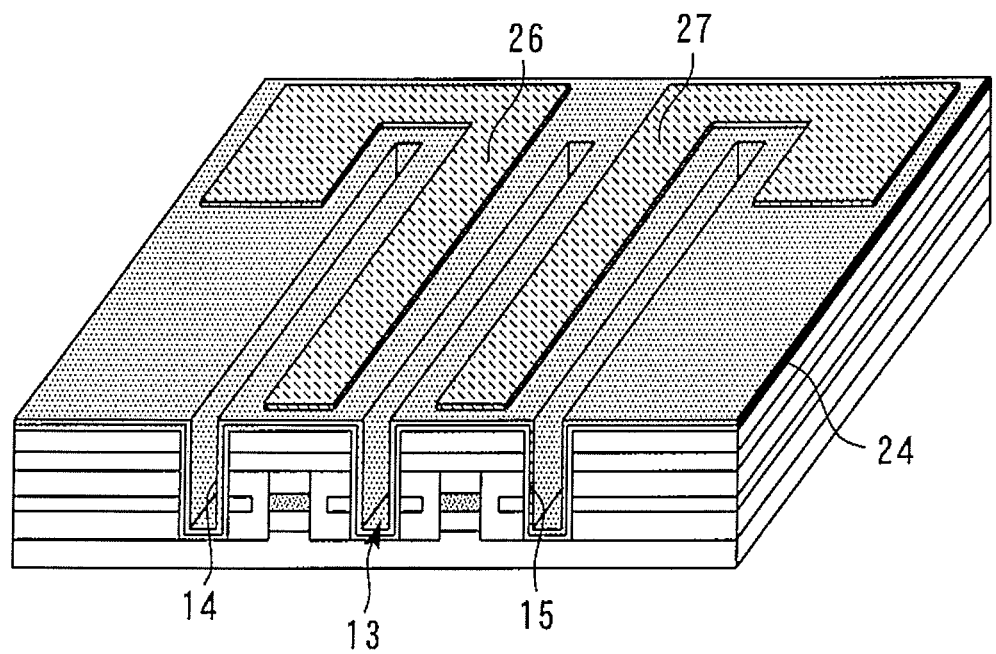
FIGS. 21 and 22 are perspective views illustrating methods of manufacturing an optical semiconductor device according to comparative example 3.
Figure 22:
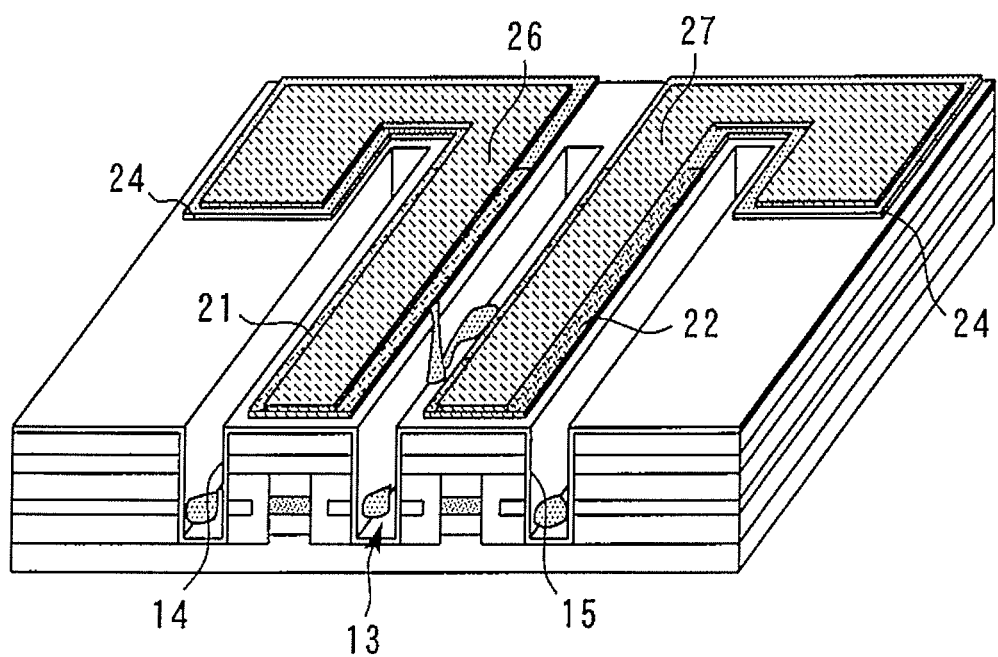

In comparative example 3, the electrode 24 is formed on the entire surface after the steps in FIGS. 1 to 9 as shown in FIG. 21. The Au plated layers 26 and 27 are formed on the top surfaces of the optical semiconductor elements 14 and 15 respectively. Next, as shown in FIG. 22, the electrode 24 is wet-etched using a resist (not shown) formed through photolithography as a mask. Since Pt-containing electrodes 21 and 22 are formed in comparative example 3, it is possible to prevent Au from sinking into the crystal. However, the electrodes of the neighboring optical semiconductor elements 14 and 15 may be short-circuited as in the case of comparative example 1.

On the contrary, in the present embodiment, no electrode 24 is formed in the separation groove 13. Therefore, when the resist 30 that covers the Au plated layers 26 and 27 is formed through photolithography, even if resist remainder is left in the separation groove 13, the Au plated layers 26 and 27 of the neighboring optical semiconductor elements 14 and 15 are never short-circuited.

Furthermore, in the present embodiment, Pt-containing electrodes 21 and 22 are formed between the optical semiconductor elements 14 and 15, and the Au plated layers 26 and 27. This Pt is a barrier metal that prevents Au from sinking into the crystal. Therefore, it is possible to prevent Au of the Au plated layers 26 and 27 from sinking into the crystal of the optical semiconductor elements 14 and 15. AS a result, reliability can be improved.

Furthermore, in the present embodiment, the electrode 24 is formed on the top surface of the connection section 16 flush with the top surfaces of the optical semiconductor elements 14 and 15. When forming the resist 30 that covers the Au plated layers 26 and 27 through photolithography, this makes it easier to match transfer conditions of the resist 30 between the top surfaces of the optical semiconductor elements 14 and 15 and the top surface of the connection section 16. Therefore, no resist remainder is left on the top surface of the connection section 16. Therefore, since the electrode 24 existing on the top surface of the connection section 16 can be etched reliably, the Au plated layers 26 and 27 of the neighboring optical semiconductor elements 14 and 15 are never short-circuited.

Furthermore, the present embodiment prevents the electrode 24 from being formed in the separation groove 13 according to the lift-off method using the resist 23. Such simple manufacturing steps can prevent the Au plated layers 26 and 27 of the neighboring optical semiconductor elements 14 and 15 from being short-circuited.

In the present embodiment, the electrode 24 is connected to only one ends of the electrodes 21 and 22, but the electrode 24 may also cover the electrodes 21 and 22. However, the electrode 24 need not cover all the electrodes 21 and 22.

Furthermore, in the present embodiment, the two optical semiconductor elements 14 and 15 are placed side by side, but the present invention is not limited to this and three or more optical semiconductor elements may be placed side by side. Furthermore, the optical semiconductor device according to the present embodiment is applicable to a semiconductor laser array or an edge-illuminated waveguide type light-receiving element array.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2011-250404, filed on Nov. 16, 2011, including specification, claims, drawings, and summary, on which the Convention priority of the present application is based, is incorporated herein by reference in its entirety.

What is claimed is:

1. A method of manufacturing an optical semiconductor device comprising: forming first and second optical semiconductor elements, separated from each other by a separation groove, on a semiconductor substrate; forming first and second electrodes containing Pt on top surfaces of the first and second optical semiconductor elements respectively; forming a third electrode electrically connected to the first and second electrodes and preventing the third electrode from being formed in the separation groove; forming first and second plated Au layers on the first and second electrodes, respectively, by electrolytic plating method, using the third electrode as a power supply layer; forming a first resist covering the first and second plated Au layers by photolithography; and etching the third electrode, using the first resist as a mask, to electrically separate the first electrode from the second electrode.

2. The method of manufacturing an optical semiconductor device according to claim 1, further comprising forming a connection section on the semiconductor substrate, wherein parts of the first and second optical semiconductor elements are connected to the connection section, respectively, the connection section has a top surface flush with the top surfaces of the first and second optical semiconductor elements, and the third electrode is formed on the top surface of the connection section.

3. The method of manufacturing an optical semiconductor device according to claim 2, wherein forming the third electrode includes:

embedding a second resist in the separation groove;

forming the third electrode on a top surface of the second resist and the top surface of the connection section; and removing the third electrode from the top surface of the second resist together with the second resist.

4. The method of manufacturing an optical semiconductor device according to claim 1, wherein the third electrode does not contain Pt, and including wet etching the third electrode in etching the third electrode.

* * * * *